US012768266B2

(12) United States Patent
Baklanov

(10) Patent No.: US 12,768,266 B2
(45) Date of Patent: Oct. 20, 2026

(54) DOWNHOLE UTILIZATION OF NOISY HIGH VOLTAGE

(71) Applicant: SCHLUMBERGER TECHNOLOGY CORPORATION, Sugar Land, TX (US)

(72) Inventor: Nikolay Baklanov, Sugar Land, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 0 days.

(21) Appl. No.: 19/136,933

(22) PCT Filed: Dec. 14, 2023

(86) PCT No.: PCT/US2023/084038

§ 371 (c)(1),
(2) Date: Jun. 9, 2025

(87) PCT Pub. No.: WO2024/137336

PCT Pub. Date: Jun. 27, 2024

(65) Prior Publication Data

US 2026/0015939 A1 Jan. 15, 2026

Related U.S. Application Data

(60) Provisional application No. 63/476,848, filed on Dec. 22, 2022.

(51) Int. Cl.
*E21B 47/12* (2012.01)
*E21B 23/01* (2006.01)
*H03H 17/02* (2006.01)

(52) U.S. Cl.
CPC .............. *E21B 47/12* (2013.01); *E21B 23/01* (2013.01); *H03H 17/02* (2013.01)

(58) Field of Classification Search
CPC .......... E21B 47/12; E21B 23/01; H03H 17/02
See application file for complete search history.

(56) References Cited

U.S. PATENT DOCUMENTS

| | | | | |
|---|---|---|---|---|
| 12,221,881 | B2 * | 2/2025 | Toniolo | E21B 23/01 |
| 2019/0101663 | A1 * | 4/2019 | Walters | G01V 1/50 |

(Continued)

OTHER PUBLICATIONS

Baklanov, N. et al., "Wireline Tractor System with User Programmable Behaviors for Semi-Autonomous Restriction Navigation", SPE/ICoTA Well Intervention Conference and Exhibition, SPE-212876-MS, Mar. 21, 2023, pp. 1-20, The Woodlands, Texas, USA.

(Continued)

*Primary Examiner* — Amine Benlagsir

(57) ABSTRACT

Systems and methods are disclosed for improved utilization of electrical power, particularly high-voltage power, supplied to a downhole component within a wellbore. An example method can include receiving electrical power at a downhole component, such as by receiving high-voltage electricity via a surface controller. The method can further include applying a filter to the electrical power to generate a stream of data points representing the electrical power over time. The method can also include categorizing those data points into a plurality of bands to form data bands. The data bands can then be interpreted as one or more signals. Based on the interpreted signals, the method can include causing a mechanical operation to be performed within the wellbore. The mechanical operation can include things such as moving a tool in a direction, changing an operating speed of the tool, and operating an anchor, arm, or linear actuator associated with the tool.

20 Claims, 15 Drawing Sheets

(56) References Cited

U.S. PATENT DOCUMENTS

| | | | | |
|---|---|---|---|---|
| 2021/0199004 | A1* | 7/2021 | Ang | E21B 47/26 |
| 2021/0373518 | A1* | 12/2021 | Spalt | G06F 17/18 |
| 2022/0307323 | A1* | 9/2022 | Cammack | E21B 49/003 |
| 2022/0364442 | A1* | 11/2022 | Petty | E21B 41/0085 |
| 2023/0417116 | A1* | 12/2023 | Duncan | E21B 23/08 |
| 2024/0018837 | A1* | 1/2024 | Eitschberger | E21B 23/0417 |

OTHER PUBLICATIONS

Kahn, T. et al., "Step-Detect", Github, Retrieved from the internet: https://github.com/thomasbkahn/step-detect, Aug. 25, 2016, 2 pages.
Mallat, S. et al., "Characterization of signals from multiscale edges", IEEE Transactions on Pattem Analysis and Machine Intelligence, Jul. 1992, pp. 710-732, vol. 14, No. 7.
Sadler, B. M. et al., "Analysis of Multiscale Products for Step Detection and Estimation", IEEE Transactions on Information Theory, Apr. 1999, pp. 1043-1051, vol. 45, No. 3.

* cited by examiner

400

| | | | | | | |
|---|---|---|---|---|---|---|
| 410 Voltage Level, V | 450 | 500 | 540 | 580 | 620 | 650 |
| 420 Range, Volts | 450...474 | 475...519 | 520...559 | 560...599 | 600...634 | 635...650 |
| 430 Band # | 1 | 2 | 3 | 4 | 5 | 6 |

DOWNHOLE UTILIZATION OF NOISY HIGH VOLTAGE

CROSS-REFERENCE TO RELATED APPLICATIONS

The present application is a National Stage Entry of International Application No. PCT/US2023/084038, filed Dec. 14, 2023, which claims priority to U.S. Provisional Application No. 63/476,848, filed Dec. 22, 2022, the entirety of which is incorporated by reference herein and should be considered part of this specification.

BACKGROUND

In wireline systems employed in the oil and gas industry to perform operations in wellbores, various tools make use of high-voltage power supplied from the surface. Typically, this high-voltage power suffers from many types of interference and noise. For example, the power can be contaminated with motor-induced electromagnetic interference (EMI), variations of electrical load, occasional bursts of high loads, and user-induced voltage walking.

These contaminating factors can severely impact the high-voltage power, causing the supplied voltage to fluctuate at the point of use deep within the wellbore. The power and telemetry systems used by downhole tools may not be optimized for dirty or noisy power, which can lead to malfunctions and errors. These, in turn, lead to operating delays and unexpected repairs, lowering productivity and increasing costs associated with the drilling operation.

As a result, a need exists for improved utilization of high-voltage power supplied downhole, even when that power is noisy or dirty in nature. This disclosure relates to de-noising a high-voltage direct current (DC) power, intelligently tracking its level and changes over time, and even utilizing voltage levels and changes as command inputs to one or more components of wireline conveyance or intervention system, drilling, or coiled tubing system.

SUMMARY

Examples described herein include systems and methods for improved utilization of electrical power supplied to a downhole component within a wellbore. In some examples, the methods disclosed herein can be performed by a wireline system for performing operations within a wellbore. An example system can include a tool string with one or more tools for performing the downhole operations. The system can also include a surface controller and a wireline operatively coupling the surface controller to the tool string. The wireline can be configured to supply regulated electrical power to the tool string, as well as data or other communications between the surface controller and tool string. Surface controller may imply a voltage stabilization schema where voltage is automatically adjusted based on known cable resistance and on measured surface current affected by the dynamic downhole load. The examples herein are described in the context of high-voltage power supply with stalization, though the description and claims are not intended to be limited in that manner unless stated explicitly.

The example systems described above and elsewhere herein can perform example methods described herein. An example method can include receiving electrical power at the downhole component, such as by receiving high voltage electricity via the surface controller. The method can further include applying a filter to the electrical power to generate a stream of data points representing the electrical power over time. The method can also include categorizing those data points into a plurality of bands to form data bands.

The data bands can then be interpreted as one or more signals. This can include comparing the data bands to one or more data-band patterns stored in a memory storage, such as by matching the data bands to a closest fitting data-band pattern. Based on the interpreted signals, the method can include causing a mechanical operation to be performed within the wellbore. The mechanical operation can include things such as moving a tool in a direction, changing an operating speed of the tool, and operating an anchor, arm, or linear actuator associated with the tool. The interpreted signals can also cause the downhole component to collect, analyze, or send telemetry information to a surface device. In some examples, the interpreted signals can cause a downhole component to execute a firmware or software script, which can in turn perform additional semi-autonomous actions.

Using the systems and methods described herein, a user can provide instructions to a downhole component simply by varying the supplied electrical power in a particular manner. This can include varying the power in a manner that substantially matches a pattern, thereby communicating a command associated with that pattern. This can be performed by hand, such as by a user tuning the supplied voltage to a lower level followed by a higher level (or vice versa), or it can be performed automatically by a device or a software that varies the voltage according to a pattern matching an intended instruction.

The examples summarized above can each be incorporated into a non-transitory, computer-readable medium having instructions that, when executed by a processor associated with a computing device, cause the processor to perform the stages described. Additionally, the example methods summarized above can each be implemented in a system including, for example, a memory storage and a computing device having a processor that executes instructions to carry out the stages described.

The examples summarized above can each be applied with the use of various types of tool driving equipment, including tractors, hydraulic pumps, and/or hydraulic/electromechanical devices that utilize pressurized fluid supplied from a hydraulic pump to drive mechanical components of the devices.

Both the foregoing general description and the following detailed description are exemplary and explanatory only and are not restrictive of the examples, as claimed.

DESCRIPTION OF THE EXAMPLES

Reference will now be made in detail to the present examples, including examples illustrated in the accompanying drawings.

Systems and methods are disclosed for improved utilization of quasi-DC electrical power, particularly high-voltage DC power, supplied to a downhole component within a wellbore. The disclosed systems and methods can reliably de-noise high-voltage power, track the current level changes over time, and establish and identify trends. The revealed voltage level can be mapped to a set of bands usable as unique command inputs to firmware downhole to trigger non-trivial sequences of operations in a firmware or software system. The command inputs can be used for conveyance needs, intervention, or a simple telemetry.

An example method can include receiving electrical power at a downhole component, such as by receiving high-voltage electricity via a surface controller. The method can further include applying a filter to the electrical power to generate a stream of data points representing the electrical power over time: voltage or other electrical quantity. The method can also include categorizing those data points into a plurality of bands to form data bands. The data bands can then be interpreted as one or more signals. Based on the interpreted signals, the method can include causing a mechanical operation to be performed within the wellbore. The mechanical operation can include things such as moving a tool in a direction, changing an operating speed of the tool, and operating an anchor, arm, or linear actuator associated with the tool.

Figure 1:
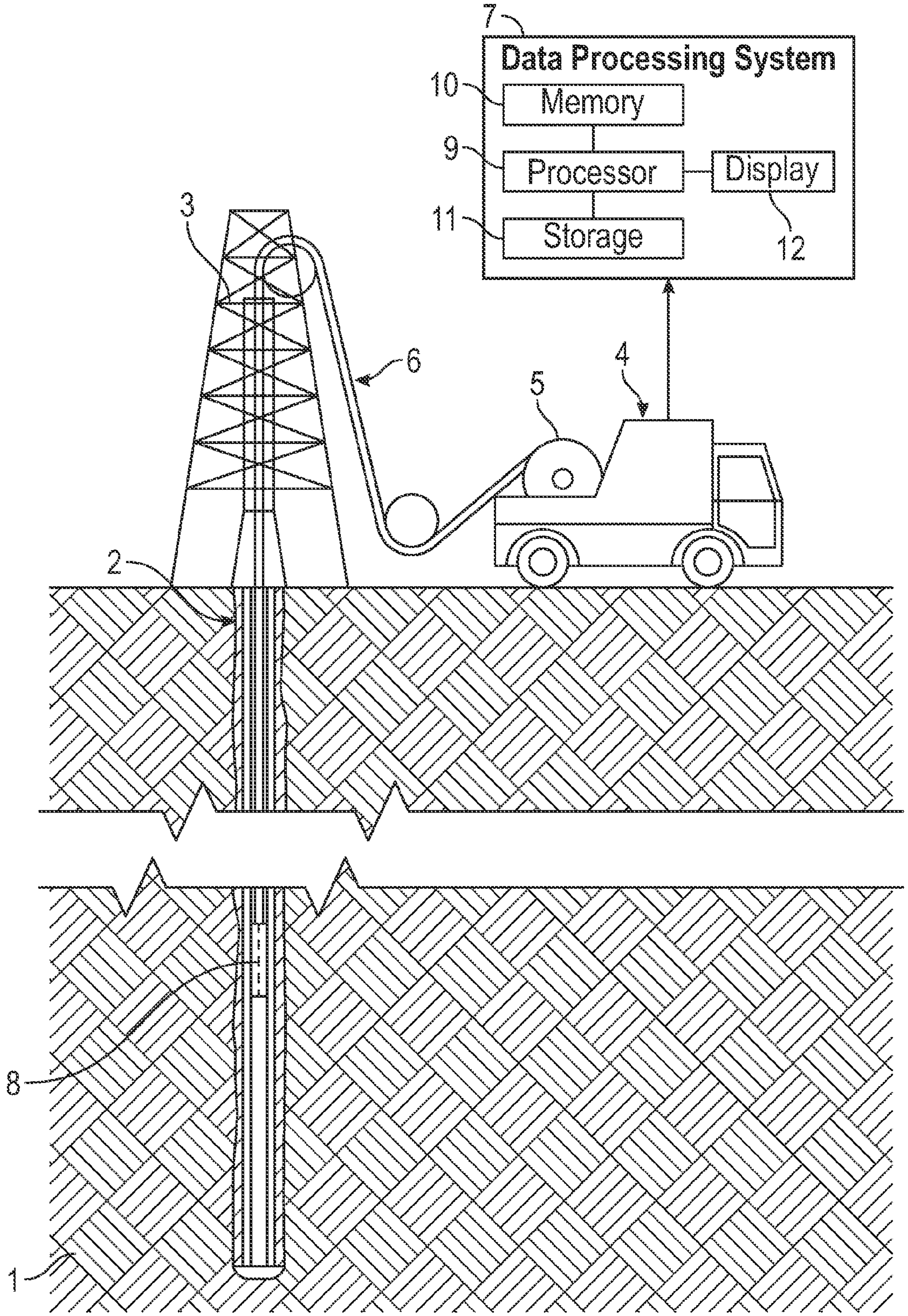
FIG. 1 is an illustration of an example wireline system suitable for use in oil and gas operations.

FIG. 1 shows an exemplary well site where the systems and methods disclosed herein may be utilized. A formation 1 has a drilled and completed wellbore 2. A derrick 3 above ground may be used to raise and lower components into the wellbore 2 and otherwise assist with well operations.

A wireline surface system 4 at the ground level includes a wireline logging unit, a wireline depth control system 5 having a cable 6, and an electronic control system 7. The cable 6 is connected to a wireline tool string 8 that may be lowered downhole. The electronic control system 7 includes a processor 9, memory 10, storage 11, and display 12 that may be used to control various operations of the wireline surface system 4, send and receive data, and store data.

In some examples, the wireline surface system 4 can deploy the cable 6, which in turn lowers the wireline tool string 8 deeper downhole. Conversely, the wireline surface system 4 can retract the cable 6 and raise the wireline tool string 8, including to the surface. The cable 6 is deployed or retracted by the wireline depth control system 5, such as by unwinding or winding the cable 6 around a spool that is driven by a motor.

The wireline logging unit communicates with the electronic control system 7 to send and receive data and control signals. For example, the wireline logging unit can communicate data received from the wireline tool string 8 to the electronic control system 7. The wireline logging unit likewise can communicate data and control signals received from the electronic control system 7 to the wireline tool string 8.

In some examples, the wireline surface system 4 can provide power to the tool string 8, including high-voltage power for operating one or more components of the tool string 8. High-voltage power can become distorted downhole for various reasons, such as motor-induced electromagnetic interference, variations of electrical load, load bursts, and user-induce voltage walking. The systems and methods described herein provide for improved utilization of this so-called “noisy” or “dirty” high-voltage power. These systems can include one or more components of the tool string 8, the electronic control system 7, or other components as described herein.

Figure 2:
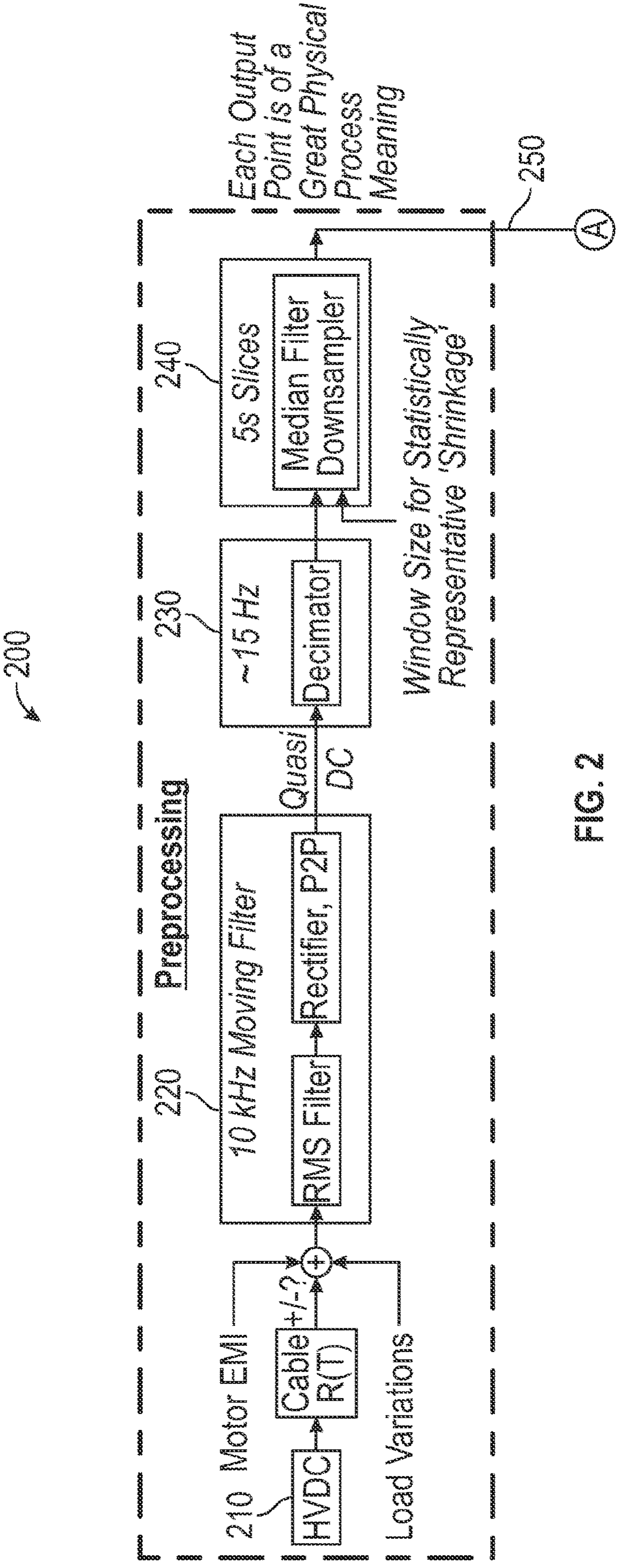
FIG. 2 is a schematic of a preprocessing module of an example system for improved utilization of a power supply in oil and gas operations.

FIG. 2 provides a schematic of a preprocessing module 200 of an example system for improved utilization of a power supply in oil and gas operations. The preprocessing module 200 can receive high voltage direct current (“HVDC”) at stage 210. Additional inputs—including possible unwanted inputs—can also be considered at the preprocessing module 200. For example, motor electromagnetic interference and load variations are shown as inputs that can skew the HVDC values received at the module 200.

At stage 220, a first filter can be applied. In the example of FIG. 2, the sampling rate is set to 10 kHz, although other sampling rates can be used. The preprocessing module 220 can include multiple time-scale, non-linear digital filters. A non-linear filter can be realized as a rolling median, such as with a shell sort embedded within the filter. The multiple filters can be arranged in a cascade format, where the output from a first filter is used as the input to a second filter. The first filter 220 of FIG. 2 can include a rectifier or peak-to-peak detector that reveals a DC trend at the relevant sampling rate, in this example 10 kHz. The rectifier can follow an RMS filter, which is a waveform-agnostic root mean squared filter configured to accept DC-biased periodic data such as EMI-modulated electrical waveforms. The back-to-back filters at a high sampling rate can yield a relatively stable DC component even in the presence of high electromagnetic interference.

The preprocessing module 200 can also include a decimator at stage 230, followed by a slicer at stage 240. These components can work to reduce processing loads for post-processing and can also create a stream of data points. The decimator at stage 230 can remove excess bandwidth and reduce the sampling frequency to reduce the volume of data. The decimator of FIG. 2 operates at approximately 15 Hz, for example, although other sampling rates can be used. The slicer at stage 240 is configured to slice the data into five-second slices, with each slice being represented by a single data entry. This operation can be based on median down sampling where each point is obtained over longer time window comparing to the initial sampling period, such as one point non-linearly averaged over a five-second slice. This avoids regular averaging (mean value) and instead removes outliers and far-away jumps out of the main DC estimate. The output 250 from the preprocessing module can be a stream of data points suitable for further processing as described below.

Figures 3, 4:
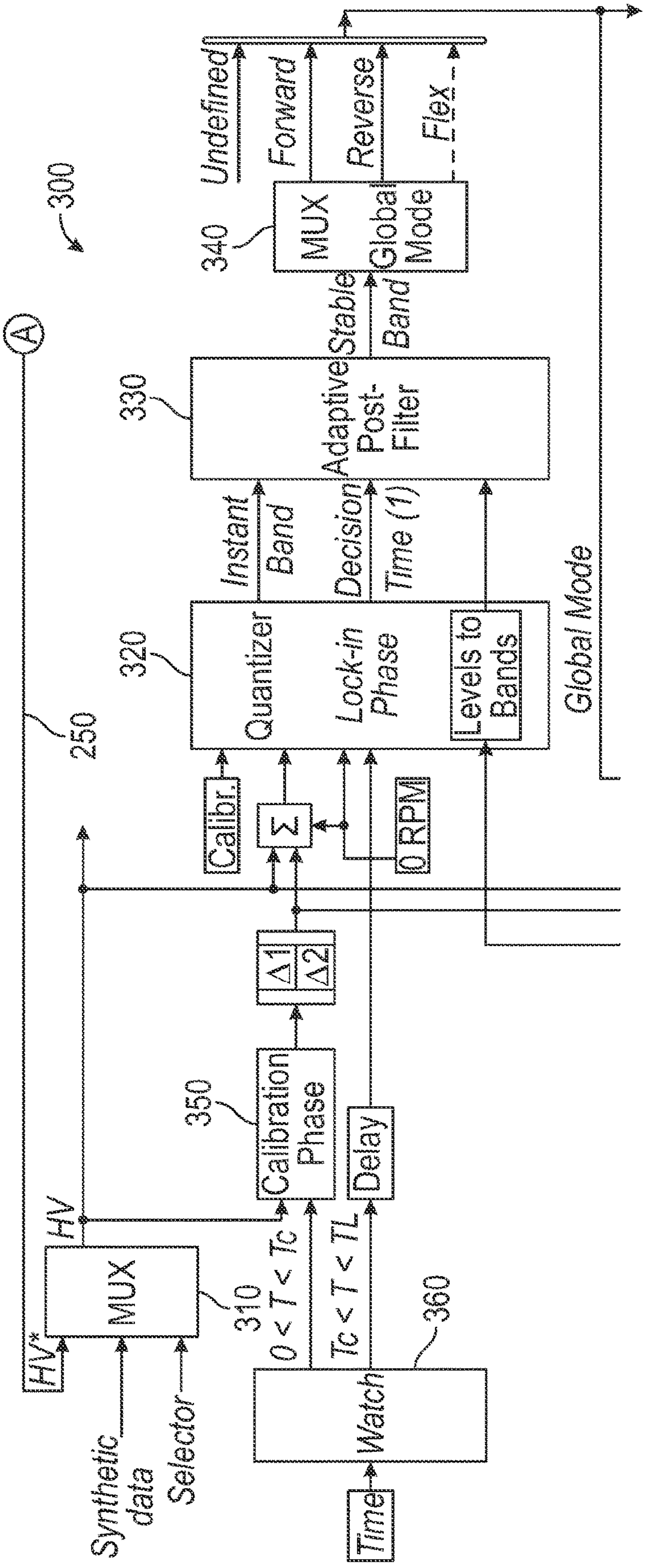
FIG. 3 is a schematic of calibration and mode selection modules of an example system for improved utilization of a power supply in oil and gas operations.
FIG. 4 is an example table of voltage banding used in an example system for improved utilization of a power supply in oil and gas operations.

For example, FIG. 3 shows a second module 300 that receives the output 250 from FIG. 2. The second module 300 can perform a calibration process and so called "lock-in phase" where system may sample the startup HVDC value to determine the tool's operational mode for effective use of limited number of bands. For motor or similar high-power applications, the method is further improved by having both a calibration phase and an associated temporal controller. The calibration can include two phases: one with motors operating and one without. The calibration is performed against a known voltage level that can be further shifted due to the motor load. For example, it can yield two offset values used at later phases to offset the DC level to match an expected nominal control level that is usable as a command. In FIG. 3, the calibration can be performed at stage 350. This stage can use multiplexed input based on the multiplexer applied at stage 310 for validation and verification purposes where synthetic or field playback data are used. Additionally, the calibration can utilize time information provided by a watch component 360.

FIG. 3 also shows a quantizer at stage 320. The quantizer can work with a user-defined table of bands defining where the DC level should be mapped. The system can convert the original analog signal to a set of discrete digital numbers corresponding to these bands. Moving temporarily to FIG. 4, a table 400 is shown illustrating band information that can be generated at stage 320. The table 400 includes a row for voltage level 410, a row for a voltage range 420 that roughly corresponds to the voltage levels 410, and a row for a band identifier 430 applied to voltage within that voltage range 420. As one example, a voltage level of 500V is associated with band number 2 and includes the voltage range of 475-519V. While six discrete bands 430 are shown in this table 400, any number of bands may be used. The width of band depends on anticipated voltage contamination in a downhole application.

Returning to FIG. 3, the output from stage 320 can feed to an adaptive post-filter at stage 330. Unlike a regular RC or FIR/IIR filter that keeps track of history over predetermined window, this filter adapts its decision window (e.g. implemented through a "stability" counter) and may reset its "candidate output" back to currently stable based on few criteria. For example, if there are any sustained +1/−1 fluctuations around the new "candidate band" plateau (e.g. more than 2, 3, . . . consecutive points) then the filter keeps last known stable band by resetting an internal counter, while the filter tolerates non-sustained short-lived occurrences of out-of-band walking (e.g. 1 point at a time) without such a reset. As an example, if the band deviation exceeds some threshold, for example if it is over +1/−1, the filter's counter resets immediately to indicate the instability. Before being further processed, the output from the adaptive post-filter at stage 330 can run through a multiplexer at stage 340 that may set a tool operational mode.

Figure 5:
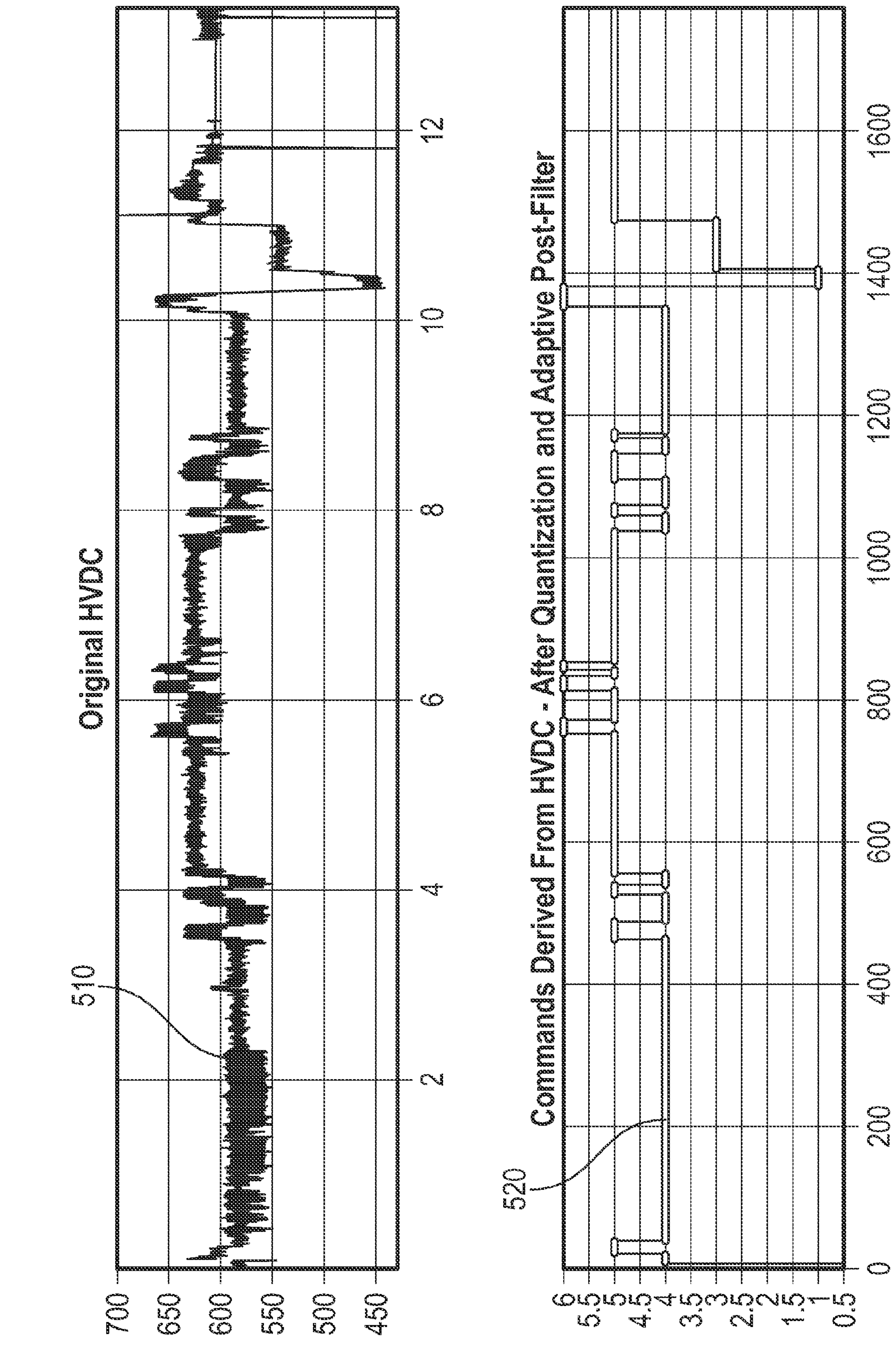
FIG. 5 is a pair of graphs showing an example electrical signal compared with commands derived from that signal for use in an example system for improved utilization of a power supply in oil and gas operations.

FIG. 5 shows an example output from FIG. 3. In particular, FIG. 5 shows an original analog signal 510, such as a high-voltage DC input as modified by any interference or other noise. After processing by the quantizer and adaptive post-filter, the original data can be output as banded data 520. This banded data 520 essentially transforms the input signal into a command signal that, at any given time, corresponds to only one data band.

Figure 6:
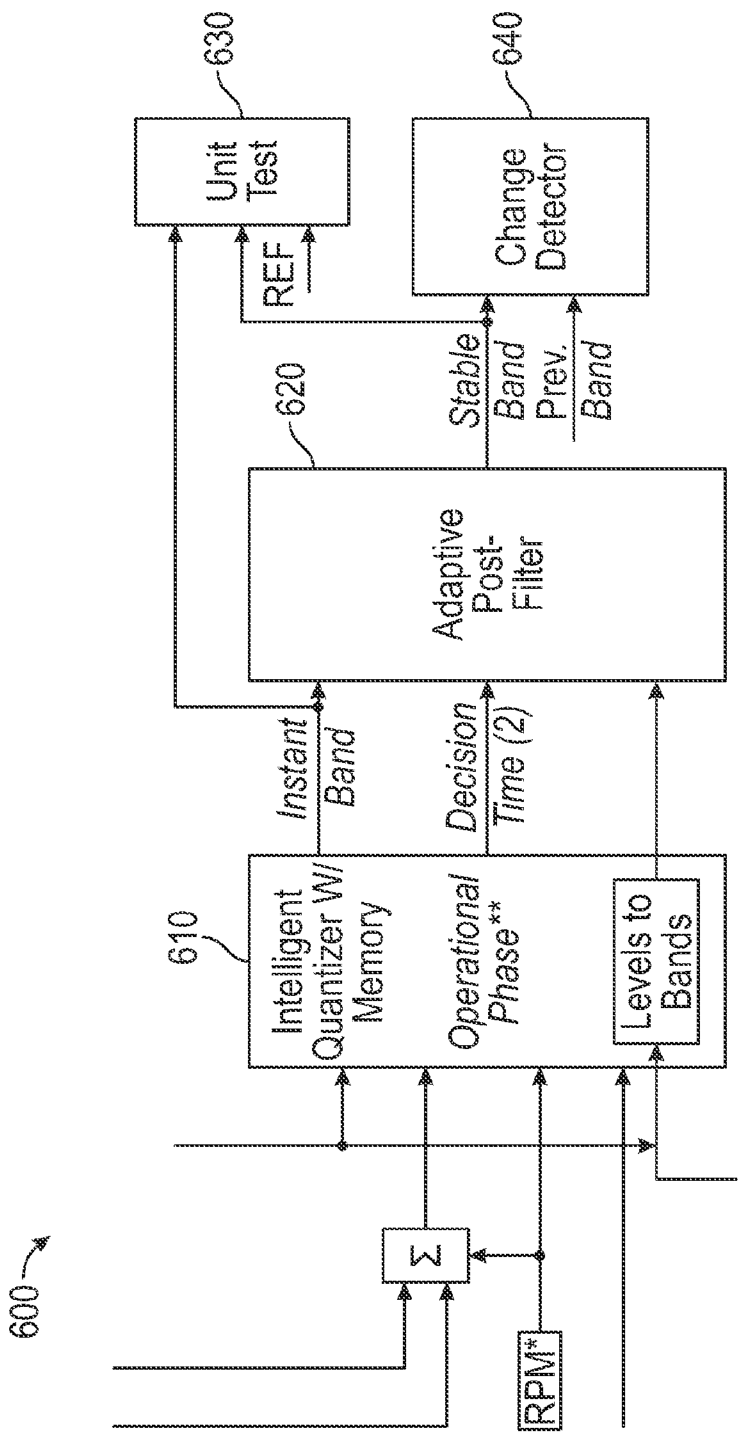
FIG. 6 is a schematic of a quantizer that produces an instant band from the supplied voltage, and a band post-filtering module (that produces a stable band from the instant band) of an example system for improved utilization of a power supply in oil and gas operations.

FIG. 6 shows a filtering module 600 at the tool's operational phase that uses the results from the module 300 of FIG. 3 (such as latched tool's operational mode) and performs further processing based on run-time inputs such as motor RPM (revolutions per minute). An intelligent quantizer with memory is used at stage 610, which feeds data to another, run-time instance, adaptive post-filter at stage 620. The intelligent quantizer, before it produces a band, compensates voltage levels based on known operational conditions, e.g. using the information whether a motor is running. The stages in module 600 can include similar functionality to stages 320 and 330 of FIG. 3, but FIG. 6 also includes a change detector stage 640 and unit test stage 630. The change detector stage 640 can be used to compare the current stable band with one or more previous bands in order to determine whether a band change should be ignored or implemented. The unit test module at stage 630 can provide a quality control mechanism to ensure the system is working properly. For clarity, the output 520 shown in FIG. 5 can also be the output from the stages of FIG. 6 rather than the stages of FIG. 3.

Figure 7:
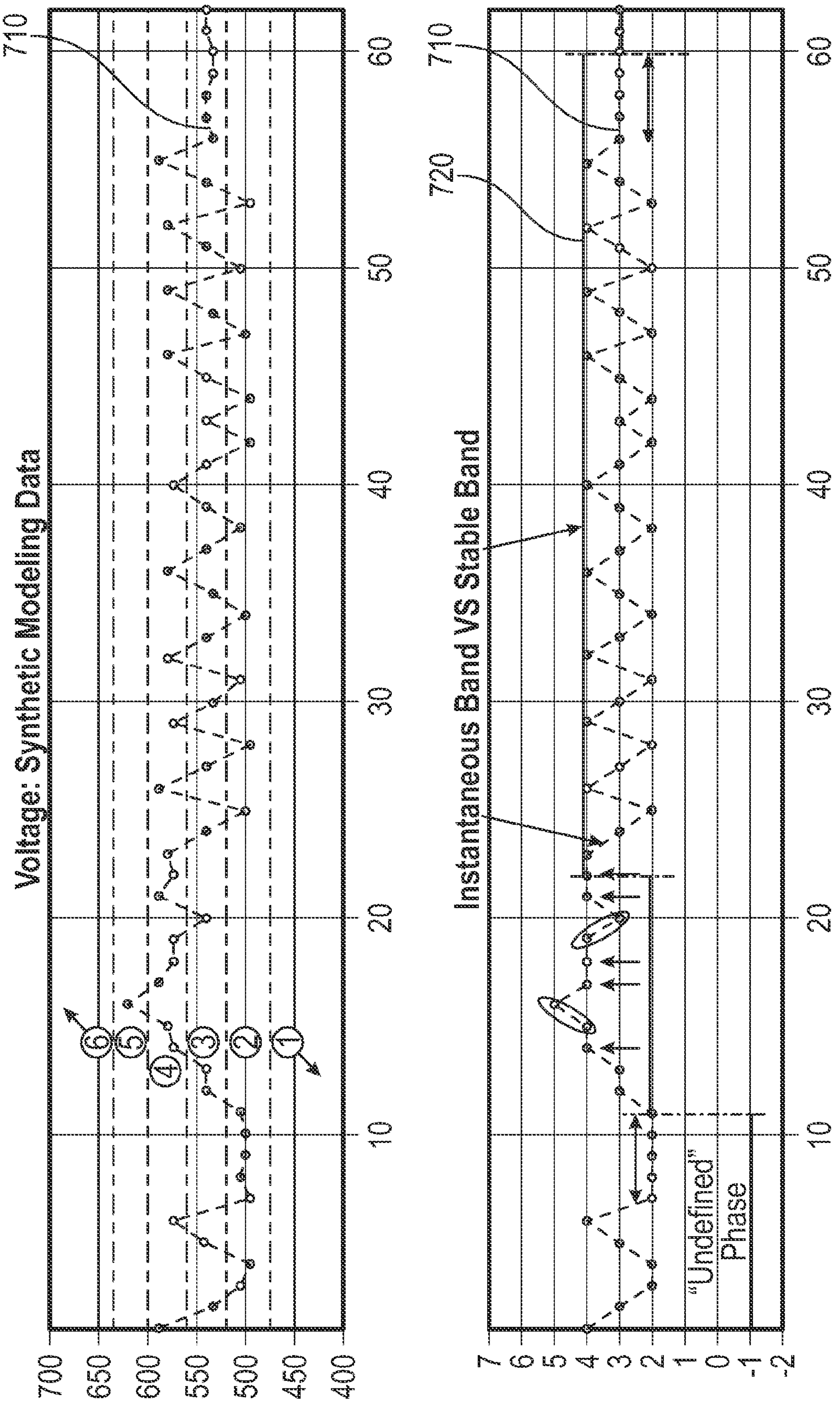
FIG. 7 is a pair of graphs showing an example electrical signal within bands that is transformed into a banded signal for improved utilization of a power supply in oil and gas operations.

FIG. 7 shows two graphs of instantaneous band information 710 generated in the manner described above. In the top graph, six voltage regions (labeled 1-6) are identified based on their voltage levels 710 that are translated into the quantized bands 710 in the lower graph. In the lower graph, stable band data 720 is overlaid on the graph to show the quantized and filtered band information for various points in time for the instantaneous band information 710.

Using this process, physical voltage is mapped to band numbers. The system uses RPM information to judge any quasi-DC-voltage shift against a historic band. The adaptive post-filtering handles AC-voltage-shift which can occur during RPM transitions or when there is a load spike for some reason. The stable band data 720 can use decision windows during intended transitions between bands such that each band should be crossed within a predetermined period of time, e.g., 15 . . . 25 seconds, to avoid latching of a band. This can account for human voltage manipulation or other temporary interruptions as opposed to larger shifts.

Figure 8:
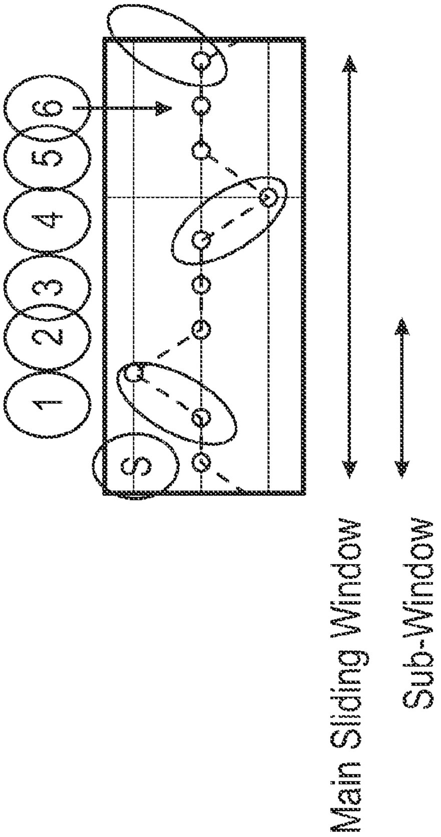
FIG. 8 is an example graph showing primary and secondary windows with decision points for improved utilization of a power supply in oil and gas operations.
Figure 9:
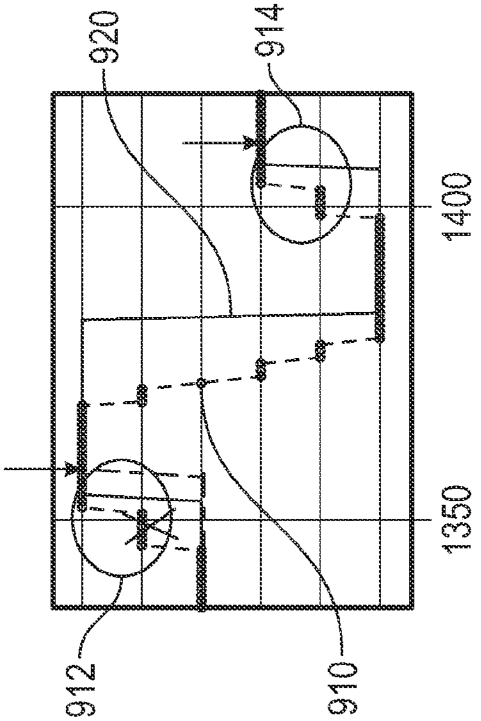
FIG. 9 is an example graph showing the tracking of band transitions and interpretation of a command based on band changes over time.

FIG. 8 is an example graph showing the concept of decision windows. In FIG. 8, points 1 and 4 (circled) are counted within the filter's history, adding up the cumulative sum for a decision. FIG. 9 shows example "deep" transitions that cross over multiple bands. The filter can detect a new band and apply historical information of the analog signal itself, and any gradient history extracted from the original signal, to determine whether the new band is transient (e.g. if the analog signal's gradient exhibits constant positive or negative trend) or should be considered the proper new band. For example, the band information 910 in FIG. 9 shows a first jump to a new band at position 912. But this jump is not reflected in the stable band data 920 because another instantaneous band jump occurs directly after. After the second jump upward, the stable band data 920 also moves up. In this example, the historical information may show that the high-voltage line typically operates at a first or second level, where the false plateau at 912 is not a commonly used voltage level, leading to the stable band data 920 to delay changing until the band information 910 moves again (or, alternatively, remains stable over a sufficient period of time to overcome relevant inferences).

The same concept is shown elsewhere in the graph of FIG. 9, as the band information 910 makes several steps down before the stable band data 920 moves down to match it. Similar, the band information 910 makes a step up at 914 which is not reflected in the stable band data 920 until the band information 910 makes yet another step up after 914.

Figure 10:
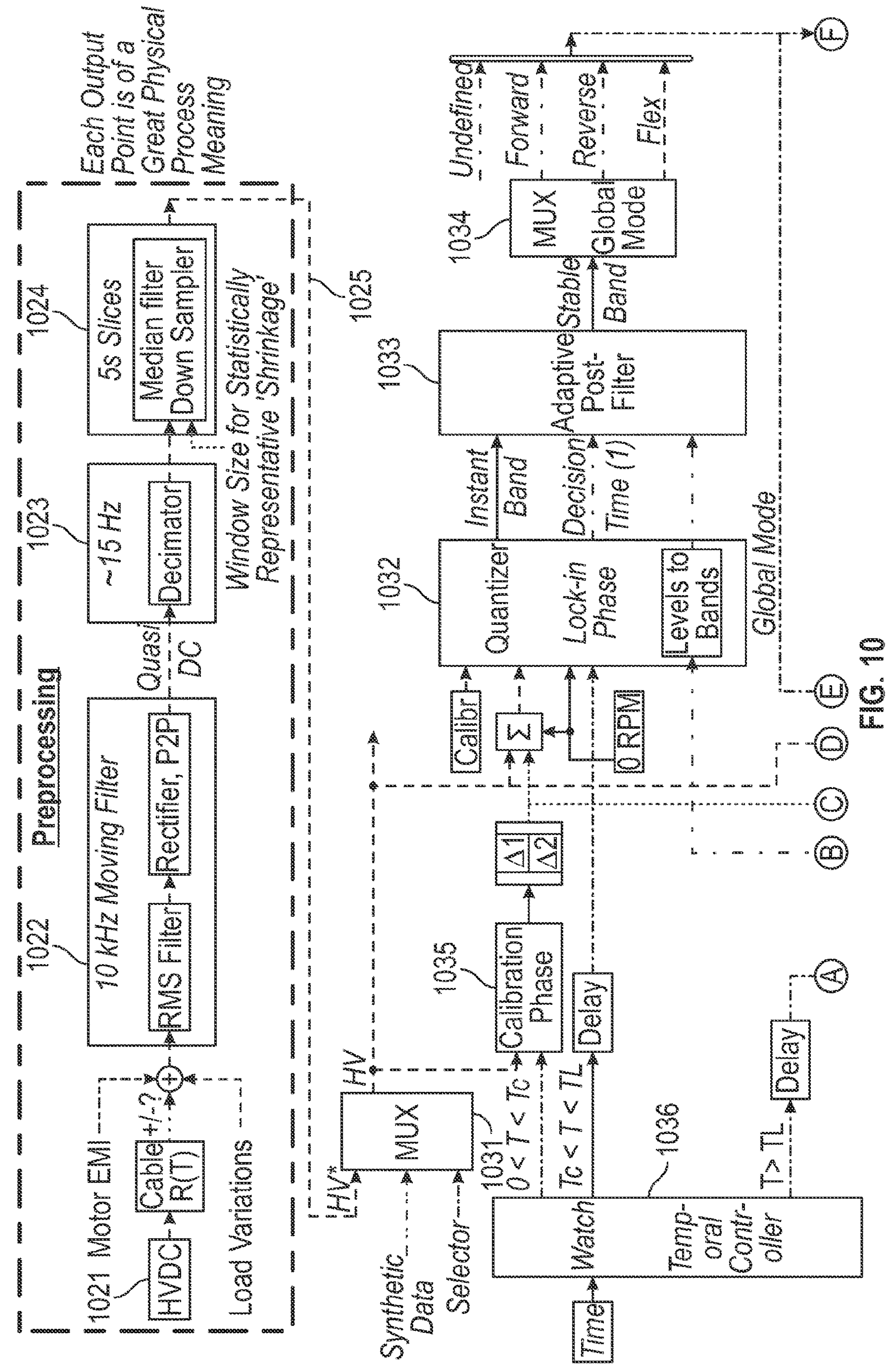
FIG. 10 is a schematic of an example system where processed voltage serves as an input to a complex state machine driven by a downhole script for use in a downhole tool.
Figure 10:
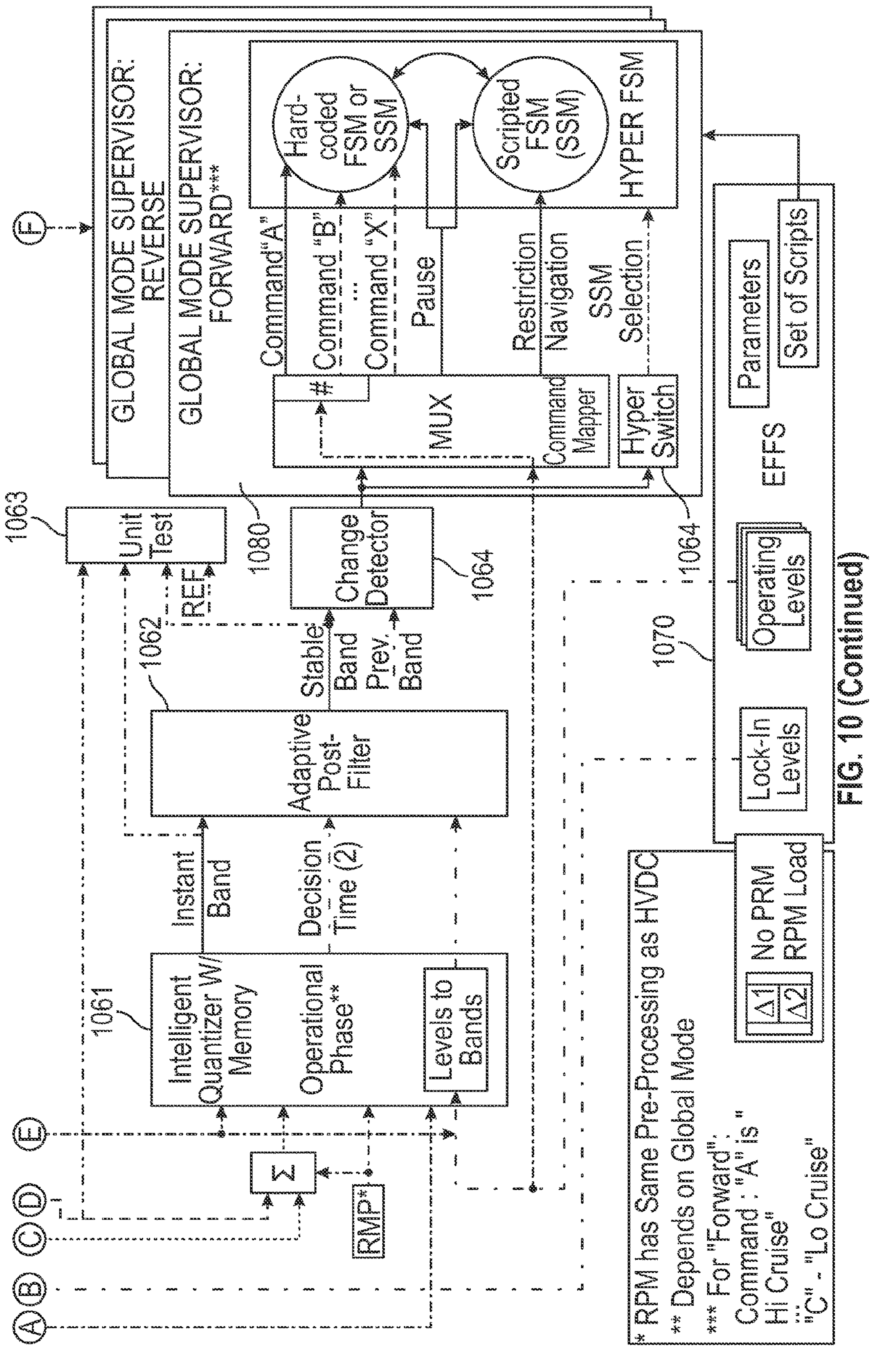

FIG. 10 shows a schematic of an example system where processed voltage may serve as an input to a complex state machine driven by a downhole script (as an option) for use in a downhole tool. High voltage direct current is received at stage 1021. Additional inputs including possible unwanted inputs—can also be considered. For example, motor electromagnetic interference and load variations are shown as inputs that can skew the HVDC values. At stage 1022, a first filter can be applied. In the example of FIG. 10, the sampling rate is set to 10 kHz, although other sampling rates can be used. The preprocessing module can include multiple time-scale, non-linear digital filters. A non-linear filter can be realized as a rolling median, such as with a shell sort embedded within the filter. The multiple filters can be arranged in a cascade format, where the output from a first filter is used as the input to a second filter. The first filter 1022 of FIG. 10 can include a rectifier or peak-to-peak detector that reveals a DC trend at the relevant sampling rate, in this example 10 kHz. The rectifier can follow an RMS filter, which is a waveform-agnostic root mean squared filter configured to accept DC-biased periodic data such as EMI-modulated electrical waveforms. The back-to-back filters at a high sampling rate can yield a relatively stable DC component even in the presence of high electromagnetic interference.

The preprocessing module can also include a decimator at stage 1023, followed by a slicer at stage 1024. These components can work to reduce processing loads for post-processing and can also create a stream of data points. The decimator at stage 1023 can remove excess bandwidth and reduce the sampling frequency to reduce the volume of data. The decimator of FIG. 10 operates at approximately 15 Hz, for example, although other sampling rates can be used. The slicer at stage 1024 is configured to slice the data into five-second slices, with each slice being represented by a single data entry. This operation can be based on median down sampling where each point is obtained over longer time window comparing to the initial sampling period, such as one point non-linearly averaged over a five-second slice. This avoids regular averaging (mean value) and instead removes outliers and far-away jumps out of the main DC estimate. The output 1025 from the preprocessing module can be a stream of data points suitable for further processing as described below.

For motor or similar high-power applications, the method is further improved by having both a calibration phase and an associated temporal controller. The calibration can include two phases: one with motors operating and one without. The calibration is performed against a known voltage level that can be further shifted due to the motor load. For example, it can yield two offset values used at later phases to offset the DC level to match an expected nominal control level that is usable as a command. In FIG. 10, the calibration can be performed at stage 1035. This stage can use multiplexed input based on the multiplexer applied at stage 1031 for validation and verification purposes where synthetic or field playback data are used. Additionally, the calibration can utilize time information provided by a watch component 1036.

FIG. 10 also shows a quantizer at stage 1032. The quantizer can work with a user-defined table of bands defining where the DC level should be mapped. The system can convert the original analog signal to a set of discrete digital numbers corresponding to these bands. The output from stage 1032 can feed to an adaptive post-filter at stage 1033. Unlike a regular RC or FIR/IIR filter that keeps track of history over predetermined window, this filter adapts its decision window (e.g. implemented through a "stability" counter) and may reset its "candidate output" back to currently stable based on few criteria. For example, if there are any sustained +1/−1 fluctuations around the new "candidate band" plateau (e.g. more than 2, 3, . . . consecutive points) then the filter keeps last known stable band by resetting an internal counter, while the filter tolerates non-sustained short-lived occurrences of out-of-band walking (e.g. 1 point at a time) without such a reset. As an example, if the band deviation exceeds some threshold, for example if it is over +1/−1, the filter's counter resets immediately to indicate the instability. Before being further processed, the output from the adaptive post-filter at stage 1033 can run through a multiplexer at stage 1034 that may set a tool operational mode.

FIG. 10 shows an additional filtering module that further processing based on additional input such as motor RPM (revolutions per minute). In particular, an intelligent quantizer with memory is used at stage 1061, which feeds data to another adaptive post-filter at stage 1062. The intelligent quantizer, before it produces a band, compensates voltage levels based on known operational conditions, e.g. using the information whether a motor is running. The stages in FIG. 10 can include similar functionality to stages 1032 and 1033, but also interface with a change detector stage 1064 and unit test stage 1063. The change detector stage 1064 can be used to compare the current band with one or more previous bands in order to determine whether a band change should be ignored or implemented. The unit test module at stage 1063 can provide a quality control mechanism to ensure the system is working properly.

The stages described above with respect to FIG. 10 can result in stable band information that is provided to a software module 1080. The software module 1080 can include a command mapper that maps the stable band information to specific commands. These commands can correspond to hard-coded or scripted commands mapped to various bands. Once interpreted, these commands can be applied in a variety of manners. For example, the commands can instruct a tool to move forward, reverse, turn on or off, begin or stop an operation, increase or decrease tool speed, or perform any other mechanically available option. As another example, the commands can generate a software instruction such as executing a script, launching or terminating an application, storing or transmitting data, turning devices on or off, or any other available option.

A user can establish various parameters 1070 that can be utilized at various stages within the system. For example, the parameters can establish band levels that either dynamically determine processes or do start-up lock of a tool operation mode, operating levels that dictate final stable band levels but not intermediately calculated band levels, sets of scripts (along with their parametrization) to run based on software/firmware instructions, and any other relevant operating parameters. These parameters 1070 can be provided at the surface using the display 12 of the data processing system 7 of FIG. 1, for example. In other example, the parameters 1070 can be provided remotely based on the data processing system 7 connecting to another remote system that can provide the parameters.

Figure 11:
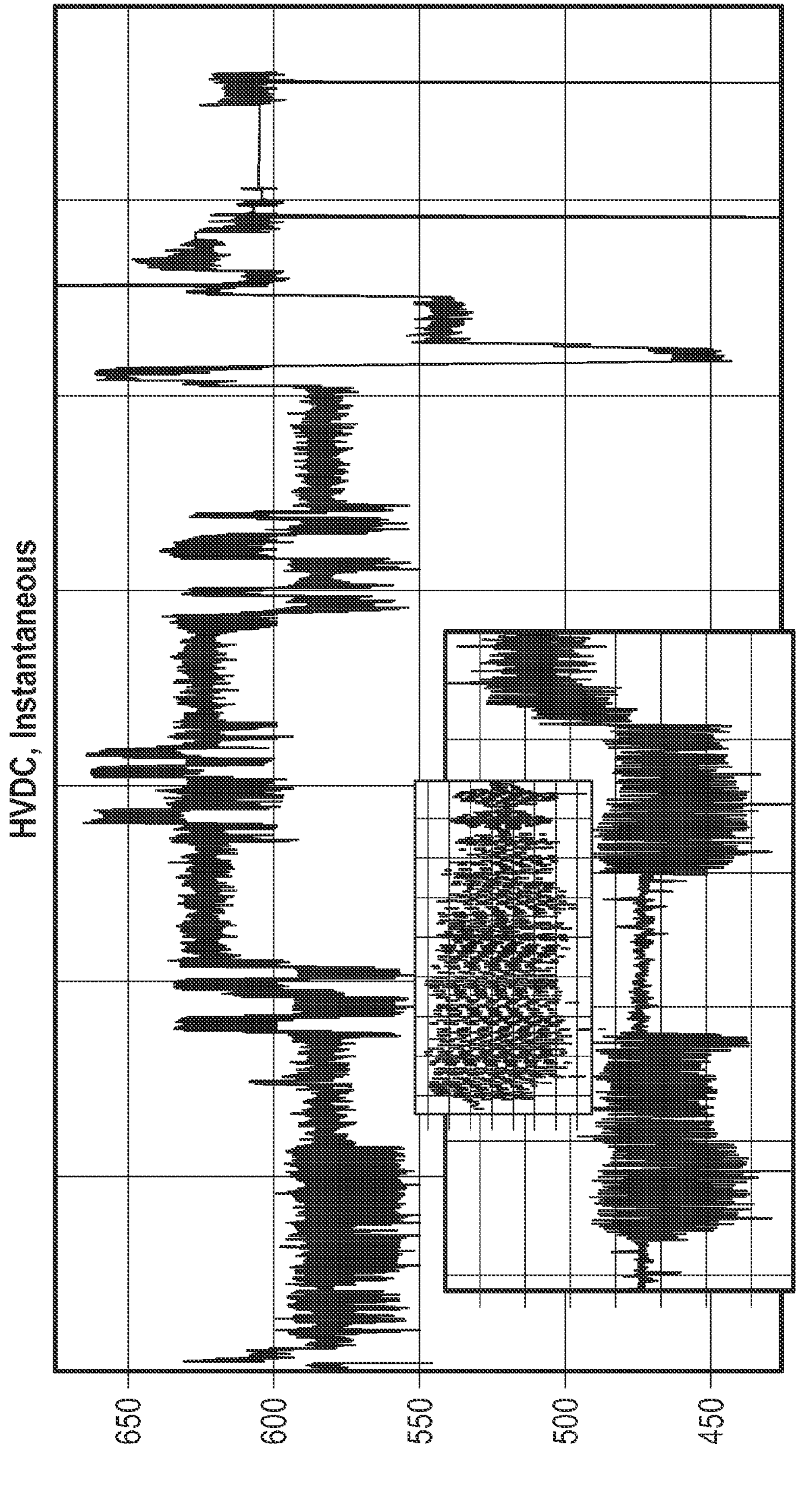
FIG. 11 is a graph showing noisy and modulated example waveforms that the disclosed systems can reliably process.
Figure 12:
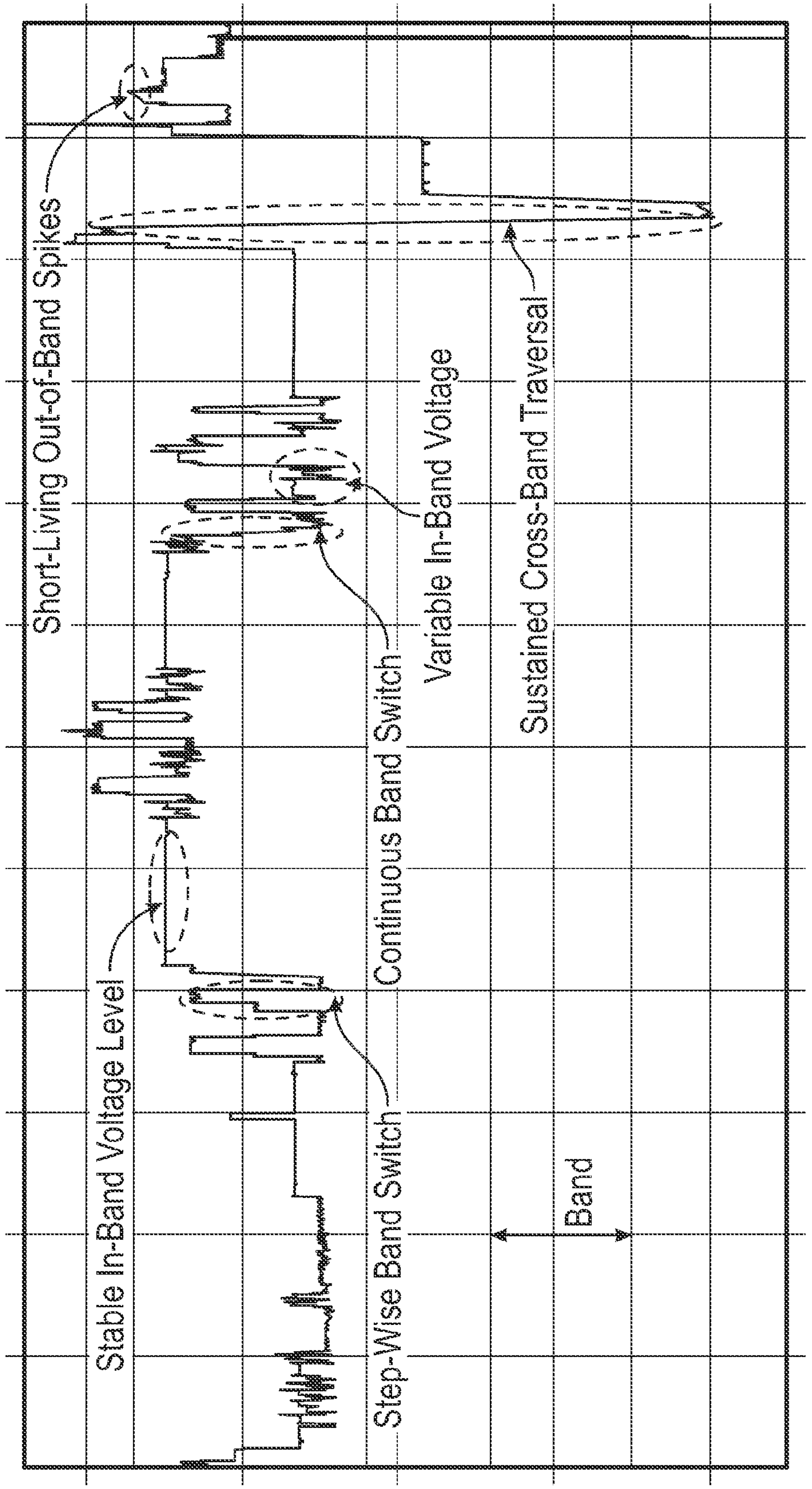
FIG. 12 is a graph showing example waveforms and patterns that the disclosed systems can reliably process.
Figure 13:
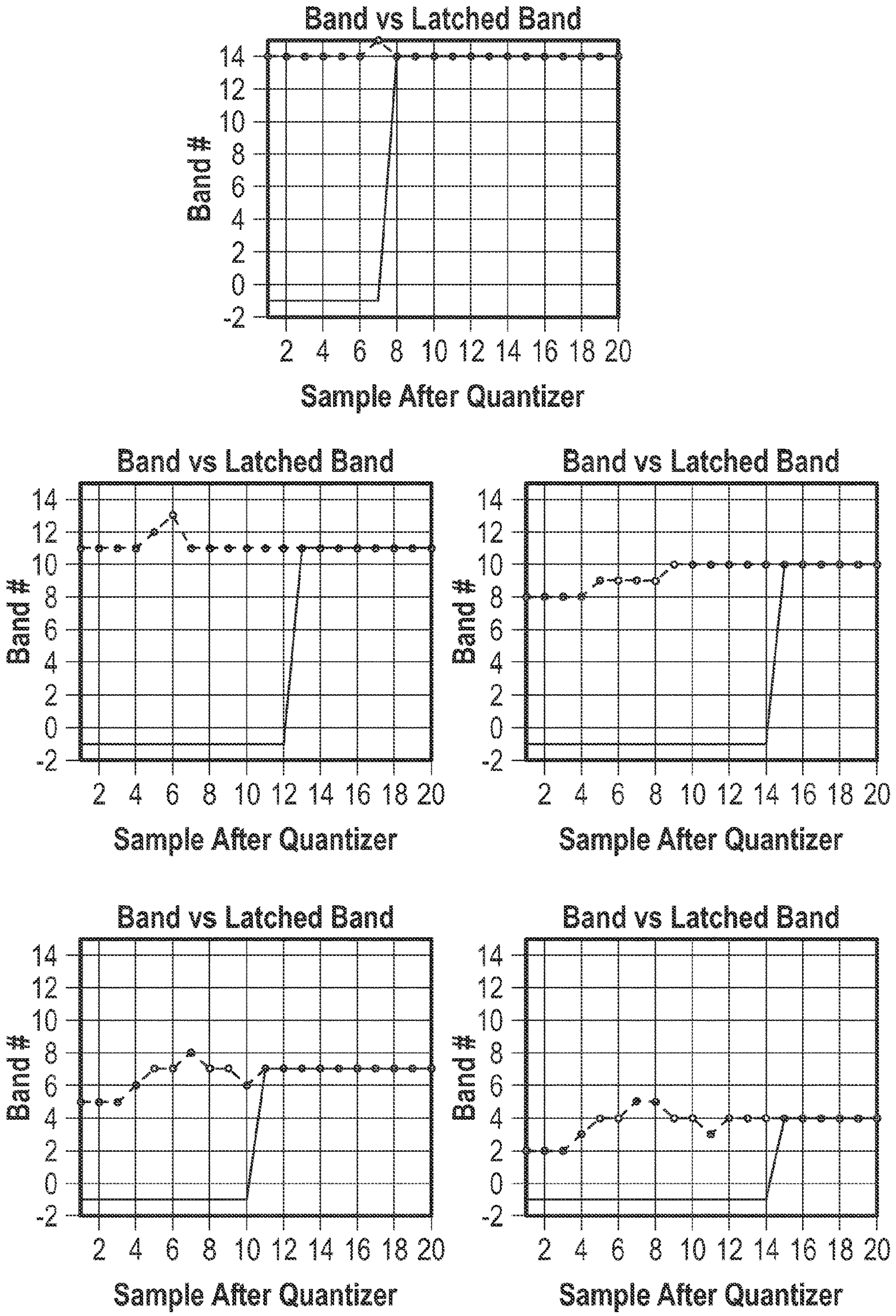
FIG. 13 is a set of graphs showing adaptive post-filter results with instantaneous bands as inputs and stable bands as outputs of a disclosed system for improved utilization of a power supply in oil and gas operations.
Figure 13:
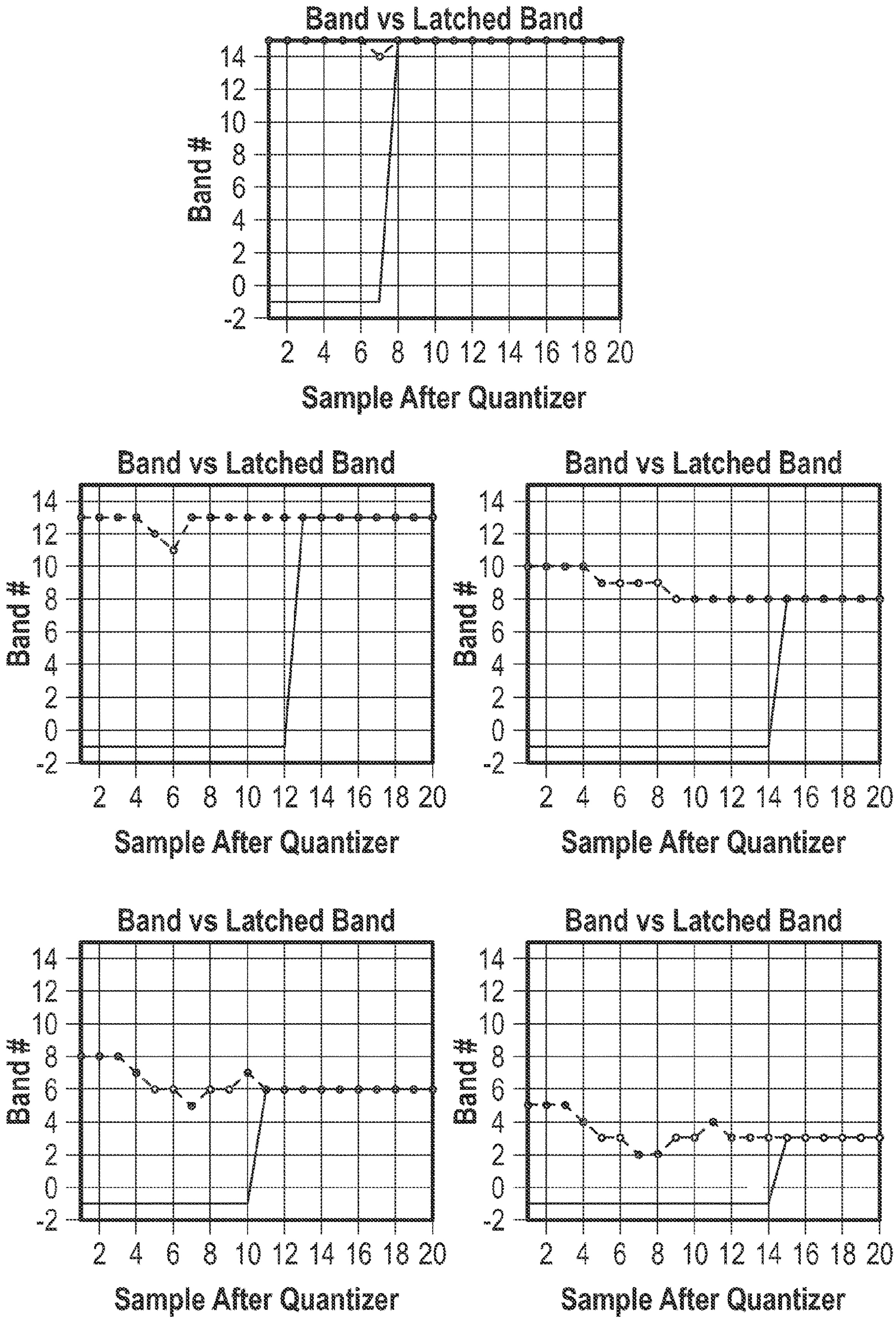
Figure 13:
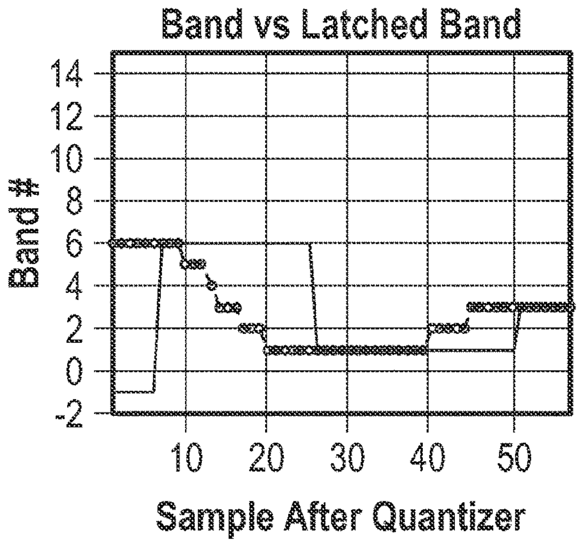
Figure 13:
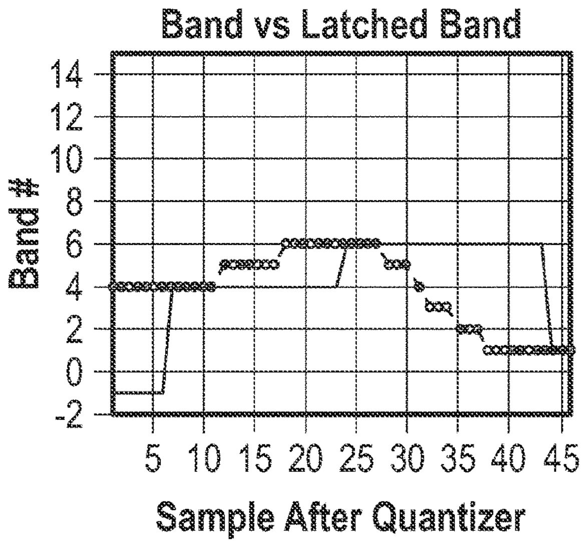
Figure 13:
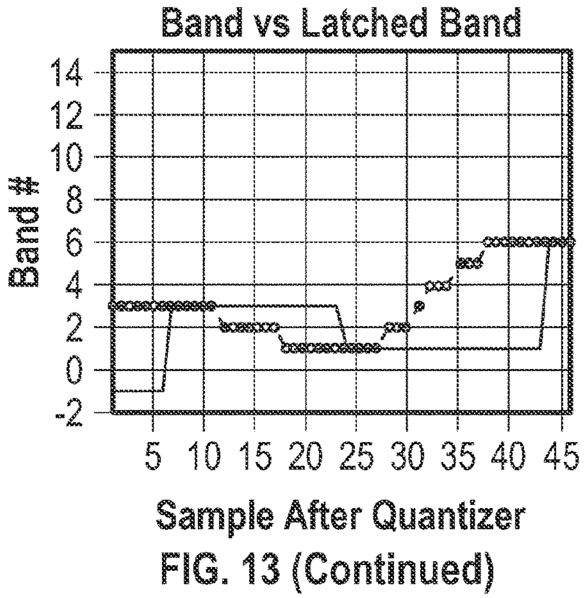
Figure 14:
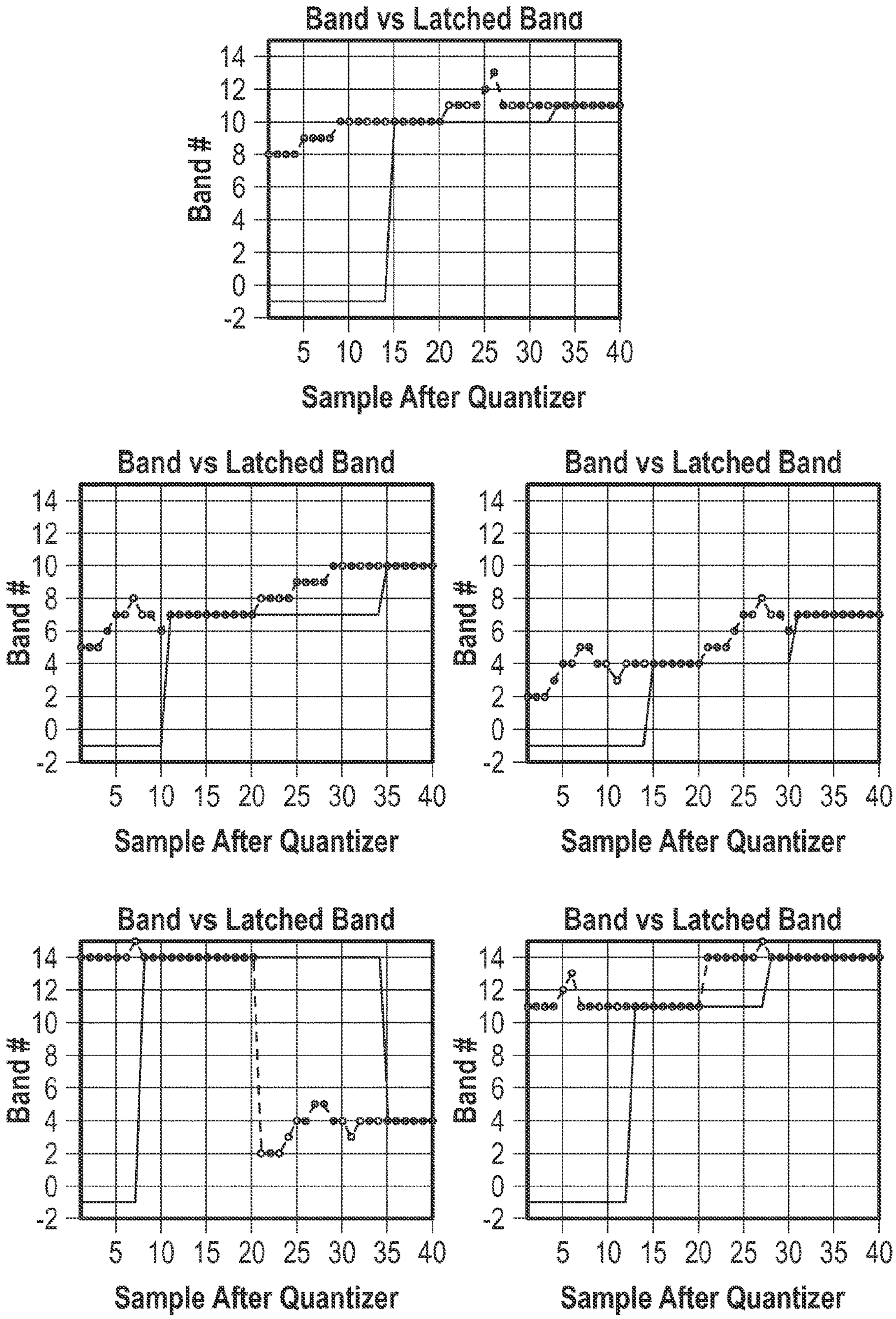
FIG. 14 is another set of graphs showing adaptive post-filter results with instantaneous bands as inputs and stable bands as outputs of a disclosed system for improved utilization of a power supply in oil and gas operations.

FIGS. 11 and 12 are graphs showing example waveforms that the disclosed systems can reliably process. FIGS. 13 and 14 provide various visual explanations of patterns relevant to adaptive post-filtering. The dotted lines are considered an input, such as a quantized instantaneous band number, while the solid lines are the filter's stable band output that may be associated with a downhole command. As shown, the filter can tolerate short-lived outbursts without immediately reacting but resets on larger changes, keeps stable band in presence of sustained fluctuations around a midpoint, and changes its output once a stable trend is detected. The filter has a window property within which the input should be stable for the filter to update its output. In one example, this is considered symmetrical, non-linear, and adaptive filtering with decision window adjustable both to the input band pattern and to the gradient of the original analog signal.

The output resulting from the systems and methods described herein can provide clear and unambiguous signals, such as the solid lines in FIGS. 13 and 14. For example, the output can be −1 for 0-5 second, 6 for 6-25 seconds, 1 for 26-50 seconds, and 3 for 51-60 seconds. These outputs (6, 1, 3) can correspond to instructions for the tool within the wellbore. For example, the outputs correspond to a mechanical operation such as moving the tool, turning the tool on or off, or adjusting the speed or function of the tool. In another example, the outputs can correspond to software or firmware instructions. This can include instructing a software or firmware component to execute one or more scripts or perform any other available action. In some examples, the output signal can include both mechanical and software commands, such as by instructing a data-logging unit to begin recording data and then instructing a cutting tool to begin a cutting operation.

Other examples of the disclosure will be apparent to those skilled in the art from consideration of the specification and practice of the examples disclosed herein. Though some of the described methods have been presented as a series of steps, it should be appreciated that one or more steps can occur simultaneously, in an overlapping fashion, or in a different order. The order of steps presented are only illustrative of the possibilities and those steps can be executed or performed in any suitable fashion. Moreover, the various features of the examples described here are not mutually exclusive. Rather any feature of any example described here can be incorporated into any other suitable example. It is intended that the specification and examples be considered as exemplary only, with a true scope and spirit of the disclosure being indicated by the following claims.

What is claimed is:

1. A method for improved utilization of electrical power supplied to a downhole component within a wellbore, the method comprising:
- receiving the electrical power at the downhole component;
- applying a first filter to the electrical power to generate a first stream of data points representing the electrical power over time;
- applying a second filter to the first stream of the data points to generate a second stream of the data points, wherein the second filter is a different type of filter than the first filter and the first filter and the second filter are applied in a cascade format;
- categorizing the data points of the second stream of the data points into a plurality of bands to form data bands;
- interpreting the data bands as one or more signals; and
- causing a mechanical operation or logging operation to be performed within the wellbore based on the one or more signals.

2. The method of claim 1, wherein said interpreting the data bands as the one or more signals comprises comparing the data bands to one or more data-band patterns stored in a memory storage.

3. The method of claim 1, wherein said interpreting the data bands as the one or more signals further comprises matching the data bands to a closest fitting data-band pattern stored in a memory storage.

4. The method of claim 1, wherein the mechanical operation is at least one of: moving a tool in a direction, changing an operating speed of the tool, and operating an anchor, an arm, or a linear actuator associated with the tool.

5. The method of claim 1, further comprising causing the downhole component to collect, analyze, or send telemetry information to a surface device.

6. The method of claim 1, further comprising causing the downhole component to execute a software script.

7. The method of claim 1, wherein the electrical power, when provided from a surface location, fluctuates between at least two levels selected based on an instruction provided by a user.

8. The method of claim 7, wherein the mechanical operation corresponds to the instruction provided by the user.

9. The method of claim 1, wherein the first filter includes a non-linear filter.

10. The method of claim 1, wherein the first filter includes a waveform-agnostic root mean squared filter.

11. The method of claim 1, wherein the second filter includes a rectifier.

12. A wireline system for performing operations within a wellbore, the system comprising:
- a tool string;
- a surface controller; and
- a wireline operatively coupling the surface controller to the tool string, the wireline configured to supply electrical power to the tool string,
- wherein the tool string comprises a power-utilization module configured to perform stages comprising:
- receiving the electrical power at a downhole component;
- applying a first filter to the electrical power to generate a first stream of data points representing the electrical power over time;
- applying a second filter in a cascade format to the first stream of the data points to generate a second stream of the data points, wherein the second filter is a different type of filter than the first filter and the first filter and the second filter are applied in a cascade format;
- categorizing the data points of the second stream of the data points into a plurality of bands to form data bands;
- interpreting the data bands as one or more signals; and
- causing a mechanical operation to be performed within the wellbore based on the one or more signals.

13. The system of claim 12, wherein said interpreting the data bands as the one or more signals comprises comparing the data bands to one or more data-band patterns stored in a memory storage.

14. The system of claim 12, wherein said interpreting the data bands as the one or more signals further comprises matching the data bands to a closest fitting data-band pattern stored in a memory storage.

15. The system of claim 12, wherein the mechanical operation is at least one of: moving the tool string in a direction, changing an operating speed of a tool on the tool string, and operating an anchor, an arm, or a linear actuator associated with the tool string.

16. The system of claim 12, further comprising causing the tool string to collect, analyze, or send telemetry information to the surface controller.

17. The system of claim 12, further comprising causing the tool string to execute a software script.

18. The system of claim 12, wherein the electrical power, when provided from a surface location, fluctuates between at least two levels selected based on an instruction provided by a user.

19. The system of claim 18, wherein the mechanical operation corresponds to the instruction provided by the user.

20. A wireline system, comprising:

a processor and memory, the memory including instructions that cause the processor to:

receive electrical power at a downhole component;

apply a first filter to the electrical power to generate a first stream of data points representing the electrical power over time;

apply a second filter in a cascade format to the first stream of the data points to generate a second stream of the data points, wherein the second filter is a different type of filter than the first filter and the first filter and the second filter are applied in the cascade format;

categorize the data points of the second stream of the data points into a plurality of bands to form data bands;

interpret the data bands as one or more signals; and cause a mechanical operation or logging operation to be performed within a wellbore based on the one or more signals.

* * * * *